United States Patent
Cho

(10) Patent No.: US 12,327,804 B2
(45) Date of Patent: Jun. 10, 2025

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventor: Hsiu-Ying Cho, Hsin Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 469 days.

(21) Appl. No.: 17/743,470

(22) Filed: May 13, 2022

(65) Prior Publication Data

US 2023/0369258 A1 Nov. 16, 2023

(51) Int. Cl.
*H01L 23/66* (2006.01)
*H01L 23/528* (2006.01)
*H01L 23/552* (2006.01)

(52) U.S. Cl.
CPC .......... *H01L 23/66* (2013.01); *H01L 23/5286* (2013.01); *H01L 23/552* (2013.01); *H01L 2223/6616* (2013.01); *H01L 2223/6627* (2013.01); *H01L 2223/6677* (2013.01); *H01L 2223/6688* (2013.01)

(58) Field of Classification Search
CPC .... H01L 23/66; H01L 23/5286; H01L 23/552
See application file for complete search history.

(56) References Cited

U.S. PATENT DOCUMENTS

| | | | |
|---|---|---|---|
| 10,418,333 B1* | 9/2019 | Kim | H01L 23/552 |
| 2010/0214041 A1* | 8/2010 | Cho | H01P 5/185 |
| | | | 29/846 |
| 2010/0219514 A1* | 9/2010 | Ohguro | H01L 23/66 |
| | | | 257/659 |
| 2019/0097320 A1* | 3/2019 | Weisman | H01Q 21/06 |
| 2019/0393148 A1* | 12/2019 | Uchida | H01L 21/84 |
| 2020/0243590 A1* | 7/2020 | Yamagishi | H01L 27/14636 |
| 2020/0350382 A1* | 11/2020 | Sim | H10K 59/352 |
| 2021/0249448 A1* | 8/2021 | Yokotani | H01L 25/167 |
| 2022/0254856 A1* | 8/2022 | Li | G09G 3/3225 |
| 2022/0310757 A1* | 9/2022 | Li | H01L 27/1214 |
| 2022/0384541 A1* | 12/2022 | Cheng | H10K 59/124 |
| 2022/0392942 A1* | 12/2022 | Tojinbara | H01L 27/14636 |
| 2022/0399305 A1* | 12/2022 | Choi | H01L 25/0652 |
| 2023/0097396 A1* | 3/2023 | Zeng | H10K 59/126 |
| | | | 257/40 |
| 2024/0177659 A1* | 5/2024 | Liu | H10K 59/126 |
| 2024/0185779 A1* | 6/2024 | Wei | G09G 3/3225 |
| 2024/0188357 A1* | 6/2024 | Liu | H10K 59/1213 |
| 2024/0213287 A1* | 6/2024 | Horikoshi | H01L 23/522 |
| 2024/0215366 A1* | 6/2024 | Liu | H10K 59/353 |
| 2024/0237396 A1* | 7/2024 | Shang | H10K 59/121 |

* cited by examiner

*Primary Examiner* — Nathan W Ha
(74) *Attorney, Agent, or Firm* — JCIPRNET

(57) ABSTRACT

A device includes a transmission line structure including a signal line, a shielding structure conductive strips spaced apart from one and another and having lengthwise directions substantially perpendicular to a lengthwise direction of the signal line, a first transistor electrically coupled to the transmission line structure, and a second transistor electrically coupled to at least one of the conductive strips to control the at least one of the conductive strips to be electrically coupled to ground or electrically floating.

20 Claims, 9 Drawing Sheets

| Wavelength \ Line | F1 | L1 | L2 | L3 | F2 |
|---|---|---|---|---|---|
| $\lambda_1$ | Floating | Ground | Ground | Ground | Floating |
| $\lambda_2$ | Floating | Ground | Ground | Floating | Floating |
| $\lambda_3$ | Floating | Ground | Floating | Ground | Floating |
| $\lambda_4$ | Floating | Floating | Ground | Ground | Floating |
| $\lambda_5$ | Floating | Ground | Floating | Floating | Floating |
| $\lambda_6$ | Floating | Floating | Floating | Ground | Floating |
| $\lambda_7$ | Floating | Floating | Ground | Floating | Floating |

FIG. 4

SEMICONDUCTOR DEVICE AND MANUFACTURING METHOD THEREOF

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Such scaling-down has also emphasized the importance of managing the transmission of radio frequency signals within such ICs. While existing IC devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 illustrates a table listing several different conditions of the shielding structure, in accordance with some embodiments.

DETAILED DESCRIPTION

Figure 1:
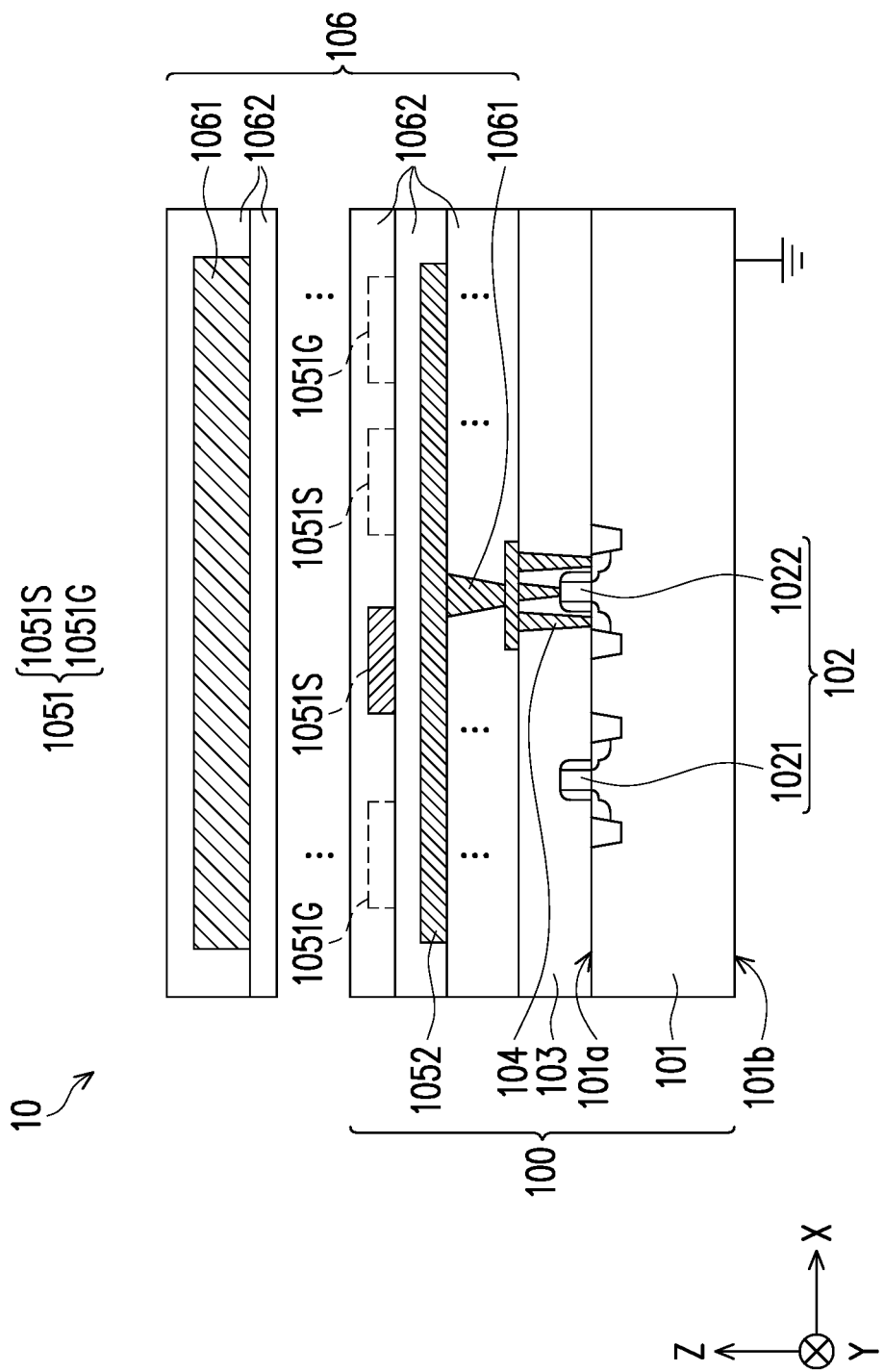
FIG. 1 illustrates a schematic cross-sectional view of a semiconductor device having a transmission line structure and a shielding structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A transmission line typically includes parallel conductors separated by a dielectric material. Signals propagate along the transmission line as electro-magnetic waves, and various physical parameters relating to the transmission line affect wave propagation. A transmission line may be regarded as a waveguide which refers to a system configured to guide electro-magnetic radiation from one point to another. In semiconductor fabrication of circuits, waveguides and transmission lines for carrying high frequency electronic signals have been implemented in a variety of ways. For example, coplanar waveguide (CPW) structures are often utilized for transmission; however, the performance of conventional CPW structures is less than desirable as electro-magnetic wavelength increases, since they occupy great chip area. For example, the electro-magnetic wavelength in a $SiO_2$ dielectric material is 3000 μm at 50 GHz, which is area-consuming for the application of impedance matching networks of quarter-wavelength long transmission lines. In addition, the conventional transmission line structure fails to provide tunable shield structure after the completion of the semiconductor processes. It is understood that a shielding structure having strip shields selectively changing between grounded and floating may provide an advantage over a fixed shield structure. A novel semiconductor device having a tunable shielding structure is provided. The variations of the embodiments are then discussed. Throughout the various views and illustrative embodiments of the present invention, like reference numbers are used to designate like elements.

Figure 2:
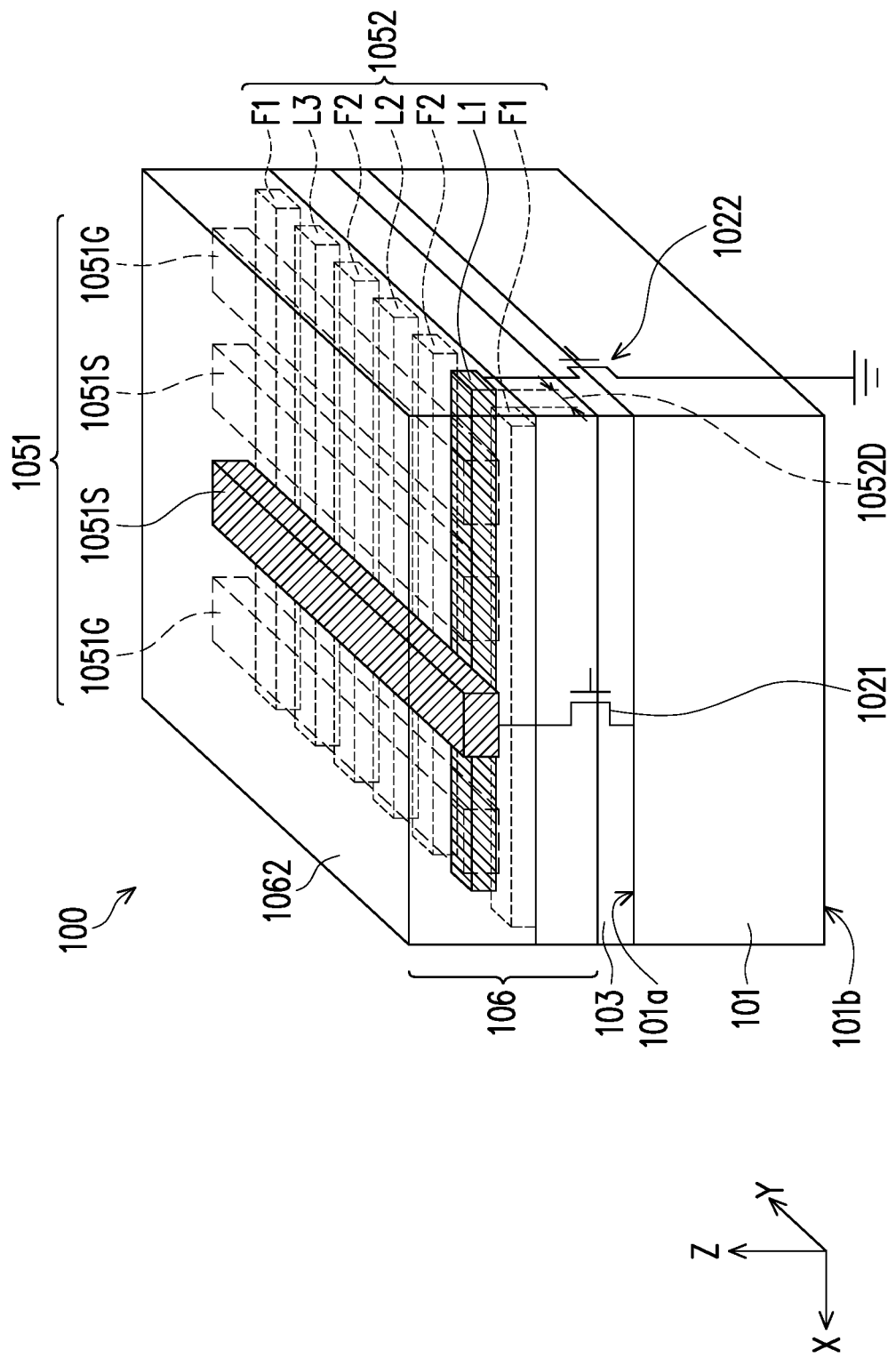
FIG. 2 illustrates a schematic and simplified perspective view of the lower portion of the semiconductor device of FIG. 1, in accordance with some embodiments.
Figure 3:
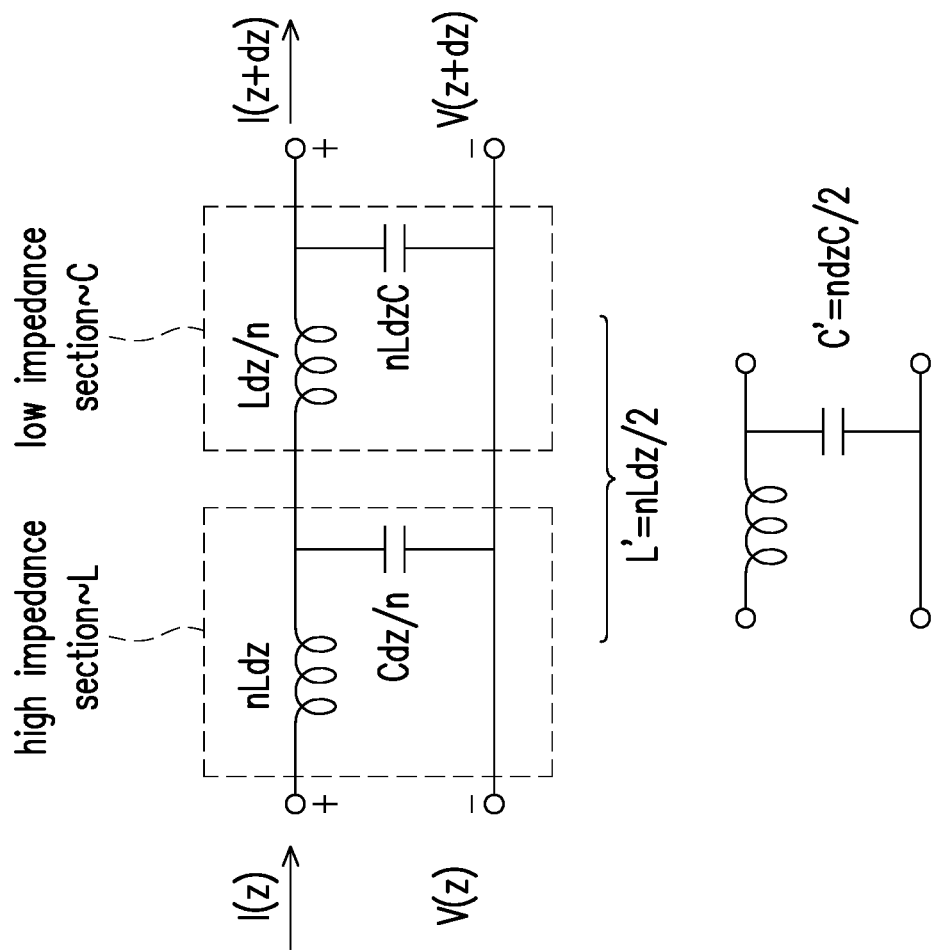
FIG. 3 illustrates an equivalent circuit of the transmission line structure of FIG. 1, in accordance with some embodiments.

FIG. 1 illustrates a schematic cross-sectional view of a semiconductor device having a transmission line structure and a shielding structure, FIG. 2 illustrates a schematic and simplified perspective view of the lower portion 100 of the semiconductor device of FIG. 1, FIG. 3 illustrates an equivalent circuit of the transmission line structure of FIG. 1, and FIG. 4 illustrates a table listing several different conditions of the shielding structure, in accordance with some embodiments. For clarity of illustrations, in the drawings are illustrated the orthogonal axes (X, Y and Z) of the Cartesian coordinate system according to which the views are oriented.

Referring to FIGS. 1-2, a semiconductor device 10 is provided. The semiconductor device 10 may be a semiconductor die, a part of a semiconductor package, or the like. The semiconductor device 10, implemented as the semiconductor die, may be formed in a wafer, which may include different die regions that are singulated in subsequent steps to form a plurality of semiconductor dies. The semiconductor die may be processed according to applicable manufacturing processes to form integrated circuits. For example, the semiconductor device 10 includes a semiconductor substrate 101, such as silicon, doped (e.g., p-type substrate regions or n-type substrate regions) or undoped, or an active layer of a semiconductor-on-insulator (SOI) substrate. The semiconductor substrate 101 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 101 has an active surface 101a (also called a front side) and an inactive surface 101b (also called a rear side).

In some embodiments, various IC devices (represented by transistors) 102 may be formed at the front side 101a of the semiconductor substrate 101. The IC devices 102 may be or include active devices (e.g., transistors, diodes, etc.), passive devices (e.g., capacitors, resistors, inductors), or the like. For example, front-end-of-line (FEOL) processes are performed to form the IC devices 102. It should be noted that a few IC devices 102 illustrated herein is merely an example, the number of the IC devices is not limited in the disclosure. An inter-layer dielectric (ILD) layer 103 is formed over the front side 101a of the semiconductor substrate 101 and may surround and cover the IC devices 102. The ILD layer 103 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), the like, or combinations thereof. Conductive plugs 104 may extend through the ILD layer 103 to electrically and physically couple to the IC devices 102. For example, the IC devices 102 include first transistors 1021 and second transistors 1022 and the conductive plugs 104 may couple the gates and source/drain regions of those transistors. The first and second transistors 1021 and 1022 may be formed as fin-type field effect transistors (FinFETs), gate-all-around (GAA) transistors, planar transistor, a combination thereof, or the like. The conductive plugs 104 may be formed of tungsten, cobalt, nickel, copper, silver, gold, aluminum, the like, or combinations thereof. For example, middle-end-of-line (MEOL) processes are performed to form the ILD layer 103 and the conductive plugs 104.

An interconnect structure 106 may be formed over the ILD layer 103 and conductive plugs 104. The interconnect structure 106 interconnects the various IC devices to form an integrated circuit. The interconnect structure 106 may be formed by metallization patterns 1061 embedded in dielectric layers 1062 on the ILD layer 103. The metallization patterns 1061 include metal lines and vias (not shown) formed in one or more dielectric layers 1062. In some embodiments, the interconnect structure 106 is formed of alternating layers of dielectric and conductive material with vias interconnecting the layers of conductive material and may be formed through any suitable process (such as deposition, damascene, dual damascene, or the like). The dielectric layers 1062 may include suitable dielectric material such as TEOS oxide, silicon oxide, silicon nitride, silicon oxynitride, hafnium oxide, zirconium oxide, titanium oxide, aluminum oxide, PSG, BPSG, other suitable dielectric materials, and/or combinations thereof. The metallization patterns 1061 of the interconnect structure 106 may be electrically coupled to the IC devices 102. For example, back-end-of-line (BEOL) processes are performed to form the interconnect structure 106.

In some embodiments, the semiconductor device 10 includes a transmission line structure 1051 (e.g., coplanar lines, micro-strips, coplanar waveguides, and/or the like) embedded in the interconnect structure 106. The transmission line structure 1051 may be electrically coupled to at least one of the first transistors 1051. In some embodiments, the transmission line structure 1051 has one or more signal line 1051S extending along the Y-direction. The length (e.g., measured in the Y-direction) of the signal line 1051S may be about 500 μm or even longer. Although the length of the signal line may vary depending on the circuit design. For example, a plurality of signal lines 1051S is disposed in parallel without ground lines disposed in proximity to them at the same level. In some embodiments, the transmission line structure 1051 is formed of a coplanar waveguide structure that includes ground lines 1051G and at least one signal line 1051S disposed between ground lines 1051G, where the ground lines 1051G and the signal lines 1051S extend along the Y-direction and are oriented substantially parallel to one another in the X-direction. In some embodiments, only one signal line 1051S is disposed between the ground lines 1051G. In some embodiments, the ground lines 1051G are omitted. It is understood that the configuration of transmission line structure 1051 is not limited by FIGS. 1-2 and may include any combination and configuration of signal lines and ground lines.

In some embodiments, the signal lines 1051S are composed of any material capable of propagating a radio frequency signal. The ground lines 1051G may be composed of any material capable of shielding. The signal lines 1051S may include the same or different material as the ground lines 1051G. For example, the signal lines 1051S and/or ground lines 1051G may include metal, such as aluminum, copper, tungsten, titanium, titanium nitride, tantalum nitride, nickel silicide, cobalt silicide, silver, metal alloys, other suitable materials, and/or combinations thereof. A region between the signal lines 1051S and the ground lines 1051G may be filled by the dielectric layer 1062 of the interconnect structure 106 or may be an insulating region, a low-k dielectric region, a high-k dielectric region, other suitable dielectric regions, other suitable regions, and/or combinations thereof.

In some embodiments, the semiconductor device 10 includes a shielding structure 1052 disposed below the transmission line structure 1051. In alternative embodiments, the shielding structure 1052 may be disposed above and/or below the transmission line structure 1051. the transmission line structure 1051 and the shielding structure 1052 may be formed in any metallization layers in the interconnect structure 106 as long as at least one of the dielectric layers 1062 separates the transmission line structure 1051 and the shielding structure 1052. For example, the shielding structure 1052 includes one or more conductive strips (e.g., F1, L1, F2, L2, and L3; also called strip shields) extending along the X-direction. The conductive strips may extend transversely to the transmission line structure 1051. For example, the conductive strips are oriented substantially parallel to one another in the Y-direction. In some embodiments, a plurality of conductive strips is placed with a periodic pattern to form an array. The conductive strips (e.g., F1, L1, F2, L2, and L3) may be perpendicular to the lengthwise direction of the transmission line structure 1051, with the angle being substantially 90 degrees. Alternatively, the angle may have other non-zero values. Each of the one or more conductive strips (e.g., F1, L1, F2, L2, and L3) may include the same material or varying materials, such as copper (Cu), aluminum-copper (AlCu), aluminum silicon copper (AlSiCu), tantalum (Ta), tantalum nitride (TaN), titanium (Ti), titanium nitride (TiN), cobalt (Co), nickel (Ni), manganese (Mn), ruthenium (Ru), lanthanum (La), tungsten (W), platinum (Pt), gold (Au), silver (Ag), metal alloys, other suitable materials, and/or combinations thereof.

The shielding structure 1052 may further extend across substantially the entire width (or a portion of the width) of the transmission line structure 1051. Each of the conductive strips (e.g., F1, L1, F2, L2, and L3) may have a same width or have varying widths. The conductive strips (e.g., F1, L1, F2, L2, and L3) may be spaced apart at any suitable spacing 1052D as shown in FIG. 2. In some embodiments, each of the conductive strips (e.g., F1, L1, F2, L2, and L3) is spaced apart equal spacing 1052D. In some embodiments, the conductive strips are arranged in an order to have the spacing in arithmetic sequence, a geometric sequence, or varying spacing. The values of spacing and width of conductive strips may affect the performance of the characteristic impedance and the characteristic wavelength of the transmission line structure, and the optimum values may vary depending on product requirements. Regions between the conductive strips (e.g., F1, L1, F2, L2, and L3) and regions between the transmission line structure 1051 and the shielding structure 1052 may be dielectric portions of the interconnect structure 106 (e.g., low-k dielectric regions, high-k dielectric regions, other suitable dielectric regions, other suitable regions, and/or combinations thereof).

Combining one or more strip shields with the one or more signal lines/ground lines may result in a quasi-tunable impedance shield. For example, at least one of the conductive strips (e.g., F1, L1, F2, L2, and L3) is electrically coupled to the second transistor 1022. The second transistor 1022 may be a selective transistor (or called control transistor) functioning as a switch to turn "on" or "off" a selected conductive strip. In some embodiments, the second transistor 1022 may be configured to control the state of the conductive strips to the electrical ground or electrical floating. For example, when the second transistor 1022 is turned "on", the conductive strip(s) controlled by the second transistor 1022 may be electrically coupled to ground. When the second transistor 1022 is turned "off", the conductive strip(s) controlled by the second transistor 1022 may be electrically floating in the semiconductor device 10. In some embodiments, all of the conductive strips (e.g., F1, L1, F2, L2, and L3) are electrically coupled to the same second transistor 1022. In some embodiments, each conductive strip (e.g., F1, L1, F2, L2, and L3) is electrically coupled to a respective second transistor 1022, or a portion of the conductive strips is electrically coupled to one of the second transistors and another portion of the conductive strips is electrically coupled to another one of the second transistors. In some embodiments, at least one of the conductive strips is coupled to the second transistor 1022, while at least one of the conductive strips, called floating strips, is not coupled to any transistor or device and remains electrically floating in the semiconductor device 10.

Referring to FIG. 3 and with reference to FIGS. 1-2, the transmission line structure 1051 may be modeled using a series of equivalent circuits. For each differential unit length (dz), the transmission line structure 1051 may be treated as if it were comprised of an equivalent circuit, such as the equivalent circuit illustrated in FIG. 3. The equivalent circuit may have an inductance per unit length (L), a capacitance per unit length (C), a resistance per unit length (R), and a conductance per unit length (G). Thus, the transmission line structure 1051 may be described using line parameters based on electric circuit concepts. The values of L, C, R, and G may be determined from the physical characteristics of the transmission line structure 1051, including its physical dimensions and material composition. The phase velocity Vp of a wave traveling along the signal line may be expressed as:

$$Vp = 1/\sqrt{(LC)} = f\lambda$$

where f is the frequency and $\lambda$ is the wavelength.

In the present embodiment, considering the relationship of the relative position between the transmission line structure 1051 and the shielding structure 1052, the transmission line structure 1051 (e.g., the signal line 1051S) including alternating segments (e.g., first segments overlying the dielectric regions and second segments overlying the conductive strips) provides alternating respective high and low impedance sections as illustrated in the equivalent circuit shown in FIG. 1C. In some embodiments where the alternating high and low impedance sections are short in length compared to the wavelength, the alternating segments may be cascaded together, so that the inductance is dominated by the high impedance section and the capacitance is dominated by the low impedance section. When the second transistor 1022 is employed to set the state (e.g., ground or floating) of one or more conductive strips (e.g., F1, L1, F2, L2, and L3), the capacitance may vary as that conductive strips change between the ground state and the floating state, thereby tuning the phase velocity. For example, according to the relationship, an increased capacitance per unit length (C) results in a smaller phase velocity (Vp), and hence a smaller wavelength $\lambda$ at a given frequency f. Thus, to design a transmission line structure to have a desired phase velocity, the wavelength may be chosen, at a given operating frequency or range of frequencies. The signal lines may be designed to carry a radio frequency signal in the microwave and/or millimeter range depending on design requirements. In addition, the wavelength may be altered or modified as required to meet particular designs. In this manner, each of the strip shields connected to a switch (e.g., the transistor) may be customized with states that are implemented on-demand based on given frequencies provided by various customer requests, as will be further described below.

Referring to FIG. 4 and with reference to FIG. 2, as an example, the table in FIG. 4 lists several conditions of the shielding structure regarding to various wavelengths. For example, for a given first wavelength ($\lambda_1$), both of the conductive strips (F1 and F2) are electrically floating and may be considered as floating strip shields, while the conductive strips (L1, L2, and L3) are electrically coupled to ground and may be considered as ground strip shields. In such embodiments, one of the second transistors coupled to the conductive strips (L1, L2, and L3) may be selectively turned "on", while another one of the second transistors coupled to the conductive strips (F1 and F2) may be selectively turned "off". Alternatively, only conductive strips (L1, L2, and L3) are coupled to the selective transistor which is made to operate as "on/off" type, while the conductive strips (F1 and F2) are not coupled to any transistor or switchable device and are maintained at a floating electric potential with respect to the conductors.

For a given second wavelength ($\lambda_2$), the conductive strips (F1, F2, and L3) are electrically floating, while the conductive strips (L1 and L2) are electrically coupled to ground. In such embodiments, one of the second transistors coupled to the conductive strips (L1 and L2) may be selectively turned "on", while another one of the second transistors coupled to the conductive strips (F1, F2, and L3) may be selectively turned "off". For example, any two of the three conductive strips (L1, L2, and L3) may be selected to be electrically coupled to ground, while other conductive strips are electrically floating, as shown in the case of the second wavelength ($\lambda_2$), the third wavelength ($\lambda_3$), and the fourth wavelength ($\lambda_4$). In some embodiments, only one of the three conductive strips (L1, L2, and L3) is selected to be electrically coupled to ground, while other conductive strips are electrically floating, as shown in the case of the fifth wavelength ($\lambda_5$), the sixth wavelength ($\lambda_6$), and the seventh wavelength ($\lambda_7$).

It should be noted that although the conductive strips (F1 and F2) shown in the table are electrically floating in all of the seven cases, the conductive strips (F1 and F2) may be electrically coupled to ground in accordance with other embodiments. For example, all of the conductive strips of the shielding structure are electrically coupled to ground or are electrically floating. The conditions shown in this table are merely an example; a customer can arbitrarily modulate the state of the conductive strips of the shielding structure based on the requirements of characteristic wavelengths. In addition, the state of the conductive strips of the shielding structure (e.g., ground or floating) is switchable by controlling the second transistors that coupled to the selective conductive strips, and thus, the capacitance is dominated by the low impedance section may be tunable. This provides benefits to customers and manufacturers since a more flexible design can be obtained to meet various requirements of transmission line structure, even after the completion of the semiconductor processes.

Figure 5:
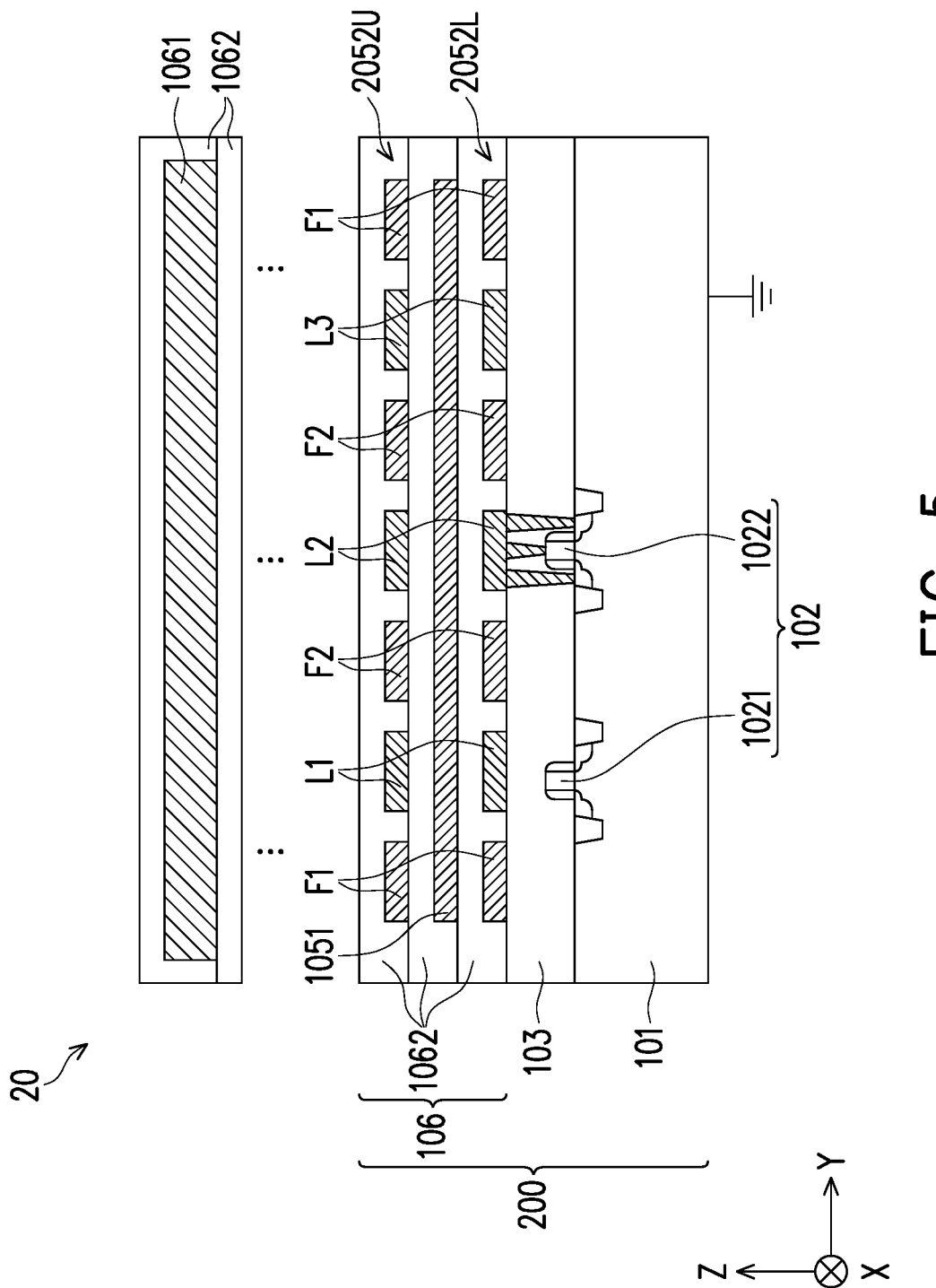
FIGS. 5 and 7 illustrate schematic cross-sectional views of variations of the semiconductor device, in accordance with some embodiments.
Figure 6:
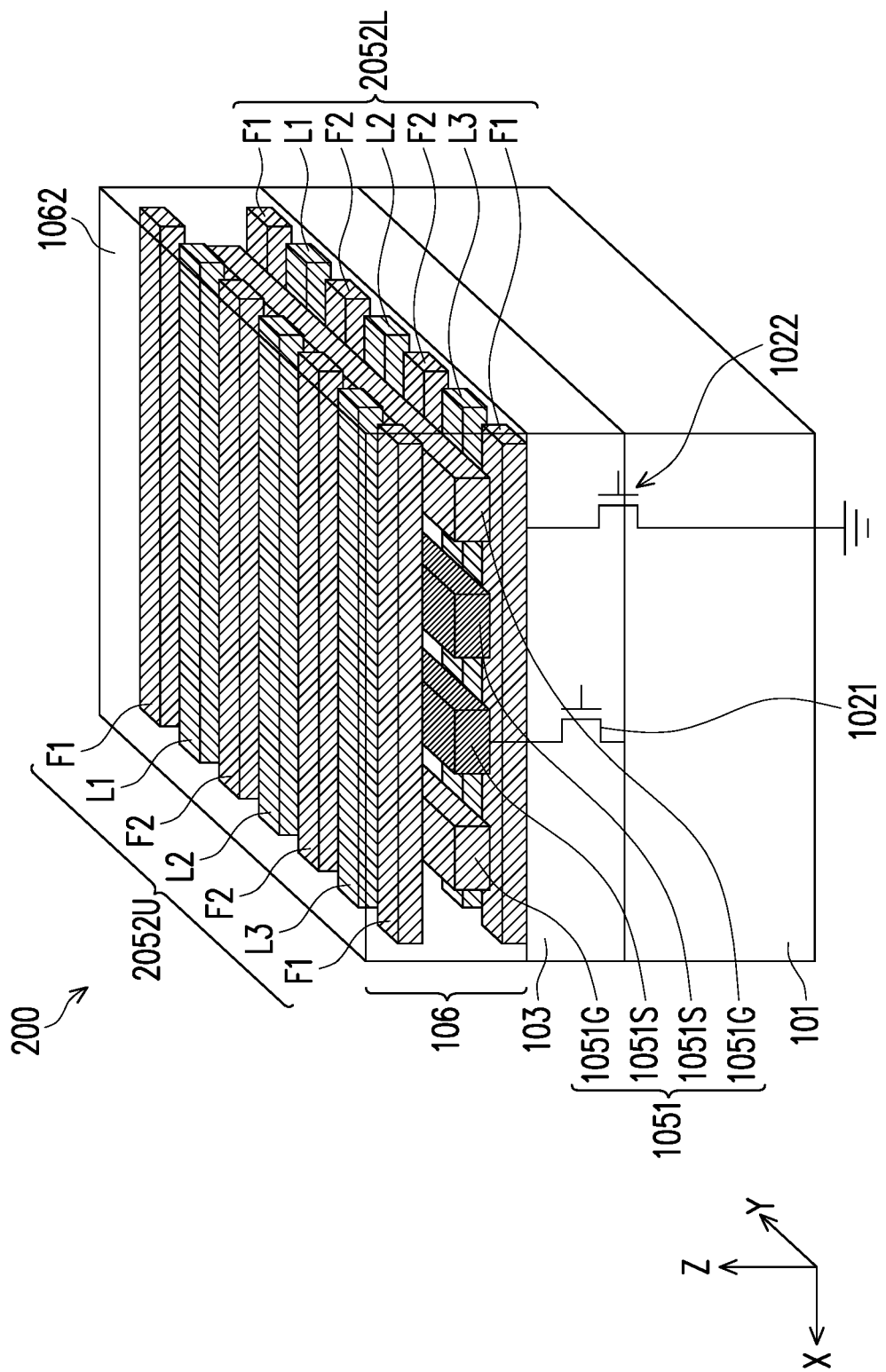
FIGS. 6 and 8 illustrate schematic and simplified perspective views of the lower portion of the semiconductor device of FIGS. 5 and 7 respectively, in accordance with some embodiments.
Figure 7:
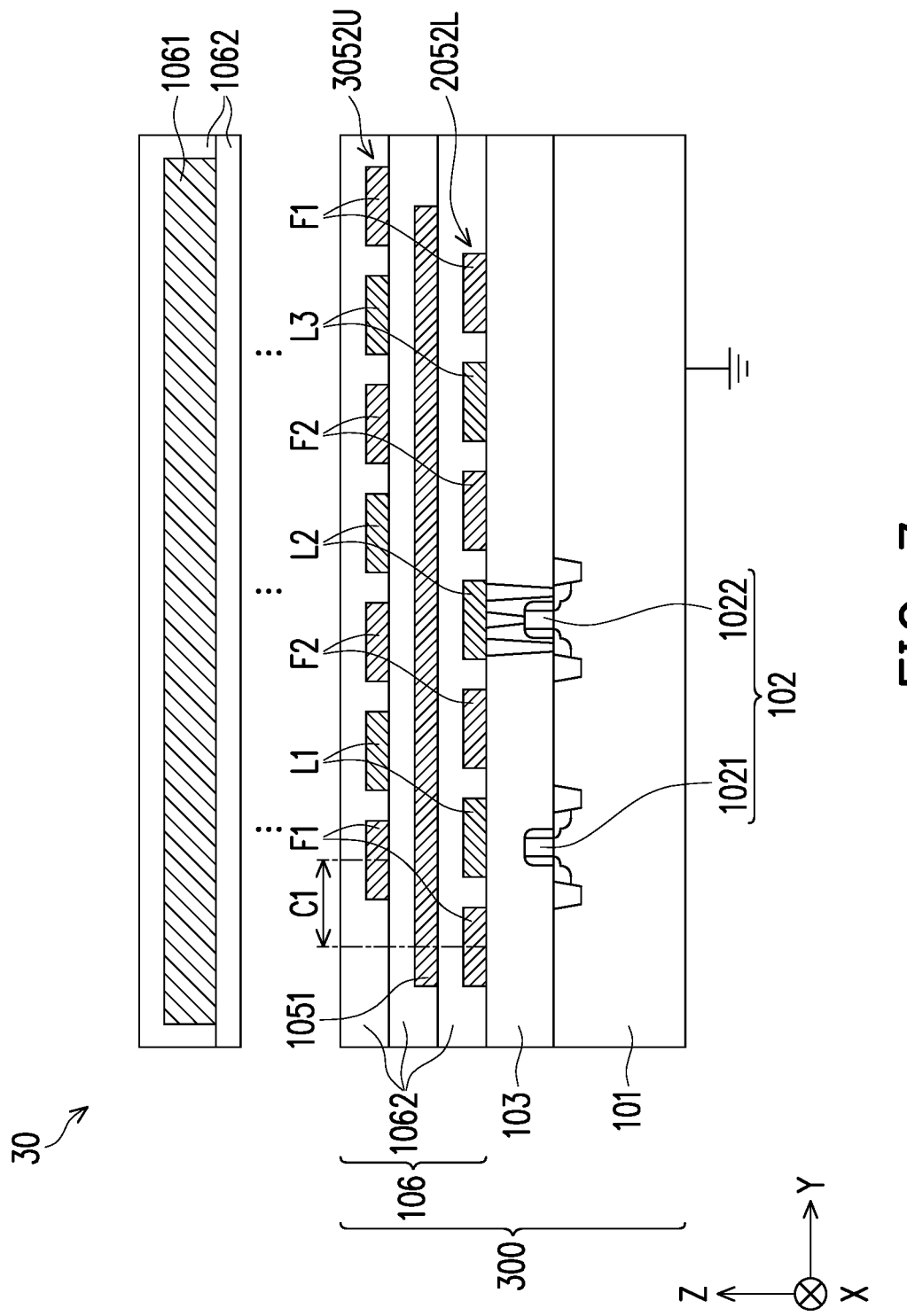
Figure 8:
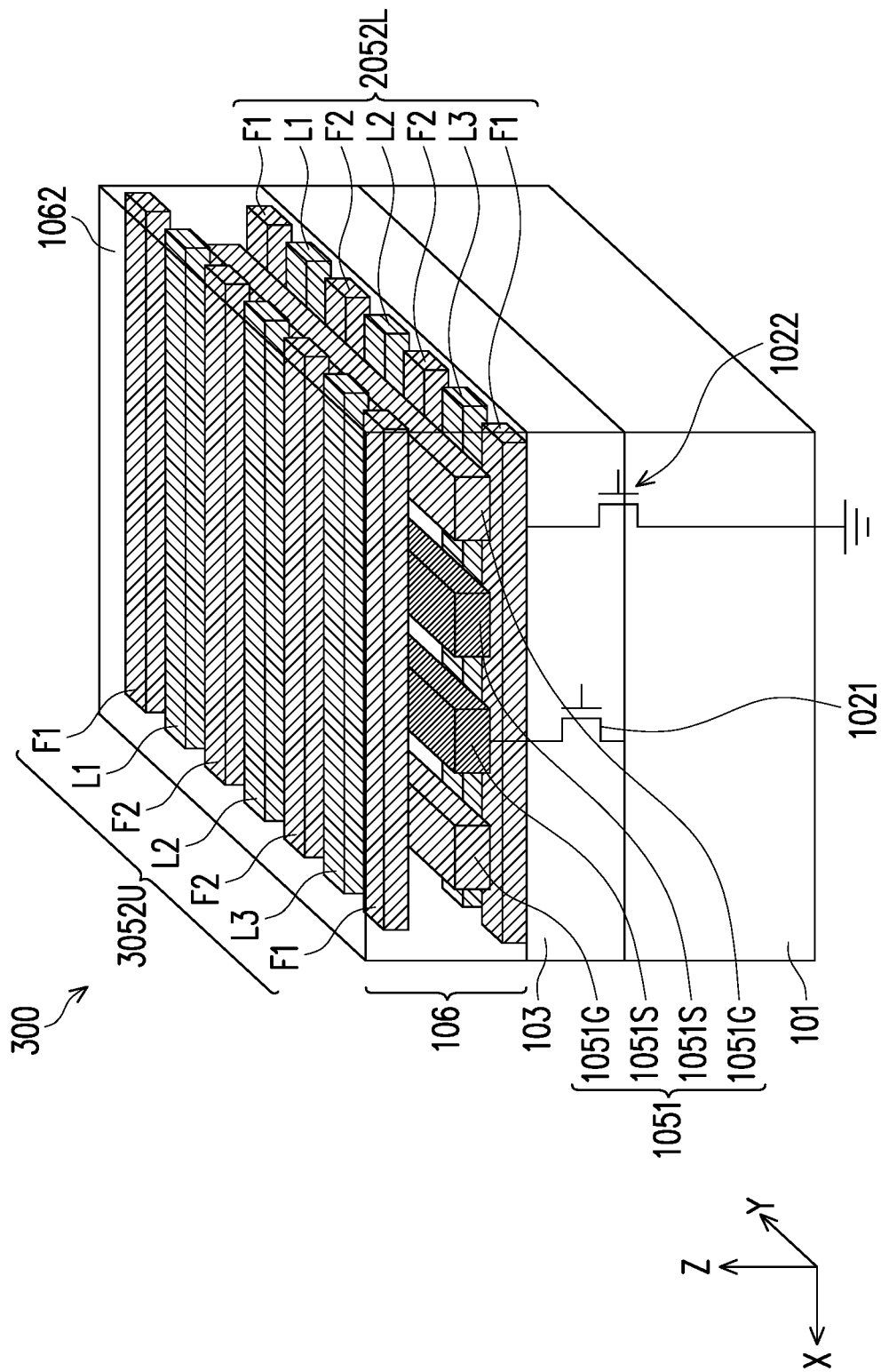

FIGS. 5 and 7 illustrate schematic cross-sectional views of variations of the semiconductor device, and FIGS. 6 and 8 illustrate schematic and simplified perspective views of the lower portion (e.g., 200 and 300) of the semiconductor device of FIGS. 5 and 7 respectively, in accordance with some embodiments. It is worth to mention that FIGS. 5 and 7 depict the Y-Z cross sections, while FIG. 1 depicts the X-Z cross section. Throughout the various views and illustrative embodiments of the present invention, like reference numbers are used to designate like elements.

Referring to FIGS. 5-6 and with reference to FIGS. 1-2, a semiconductor device 20 is similar to the semiconductor device 10, and thus the detailed descriptions thereof are not repeated for the sake of brevity. The difference between the semiconductor devices 20 and 10 includes that an upper shielding structure 2052U and a lower shielding structure 2052L respectively disposed above and below the transmission line structure 1051. Each of the upper shielding structure 2052U and the lower shielding structure 2052L may include a plurality of conductive strips (e.g., F1, L1, F2, L2, and L3) and may be similar to the shielding structure 1052 described in the preceding paragraphs. In addition, the conductive strips (e.g., F1, L1, F2, L2, and L3) may be designed to be electrically coupled to ground or electrically floating as described in FIG. 4.

In some embodiments, at least one of upper shielding structure 2052U and the lower shielding structure 2052L is electrically coupled to one or more second transistor(s) 1022. Although a few transistors is illustrated herein, it should be understood that a plurality of second transistors may be formed on the semiconductor substrate 101 and coupled to a single, a portion, or all of the conductive strips of the upper shielding structure 2052U and the lower shielding structure 2052L for switching between the floating state and the ground state. In some embodiments, each conductive strip of the upper shielding structure 2052U and a corresponding conductive strip of the lower shielding structure 2052L right below the respective conductive strip are set to be in the same state (e.g., the ground state or the floating state). Alternatively, one of the conductive strips of the upper shielding structure 2052U is set to be electrically floating, while a corresponding conductive strip of the lower shielding structure 2052L right below the one of the conductive strips is set to be electrically coupled to ground.

In some embodiments, each of the conductive strips of the upper shielding structure 2052U is disposed right directly over one of the conductive strips of the lower shielding structure 2052L. For example, the individual conductive strips of one of the upper shielding structure 2052U and the lower shielding structure 2052L may be arranged in vertical alignment (i.e., along the Z-direction) with a corresponding conductive strip of another of upper shielding structure 2052U and the lower shielding structure 2052L. In the cross section, a center of one of the conductive strips of the upper shielding structure 2052U is substantially aligned with a center of a corresponding conductive strip of the lower shielding structure 2052L right below the one of the conductive strips. The dimension and spacing of the conductive strips of the upper shielding structure 2052U may be substantially the same as those of the conductive strips of the lower shielding structure 2052L. For example, an orthogonal projection area of each of the conductive strips of the upper shielding structure 2052U is entirely overlapped with an orthogonal projection area of one of the conductive strips of the lower shielding structure 2052L. The upper shielding structure 2052U may be interconnected to the lower shielding structure 2052L through conductive vias (not shown). Alternatively, the upper shielding structure 2052U is not interconnected to the lower shielding structure 2052L.

Referring to FIGS. 7-8 and with reference to FIGS. 5-6, a semiconductor device 30 is similar to the semiconductor device 20, except that the upper shielding structure 3052U is laterally offset from the lower shielding structure 2052L at least in the Y-direction. For example, a center of one of the conductive strips of the upper shielding structure 3052U is laterally staggered with a center of a corresponding conductive strip of the lower shielding structure 2052L right below the one of the conductive strips by an offset C1, where the value of the offset C1 is non-zero. The value of the offset C1 may vary depending on product and design requirements. In some embodiments, an orthogonal projection area of each of the conductive strips of the upper shielding structure 3052U may be at least partially overlapped with an orthogonal projection area of one of the conductive strips of the lower shielding structure 2052L. Alternatively, an orthogonal projection area of at least one of the conductive strips of the lower shielding structure 3052L that is closest to the edge of the semiconductor device 30 is fully exposed by an orthogonal projection area of the upper shielding structure 3052U, or vice versa. It should be noted that the configuration and the number of the upper shielding structure and the lower shielding structure illustrated herein are merely an example, one or more arrays of conductive strips may be arranged above and/or below the transmission line structure 1051 in a variety of manners. The number of the conductive strips of the upper shielding structure may be different from that of the conductive strips of the lower shielding structure, in accordance with other embodiments. As long as the upper shielding structure and the lower shielding structure at least partially cover the signal line(s) in the top-down view.

Figure 9:
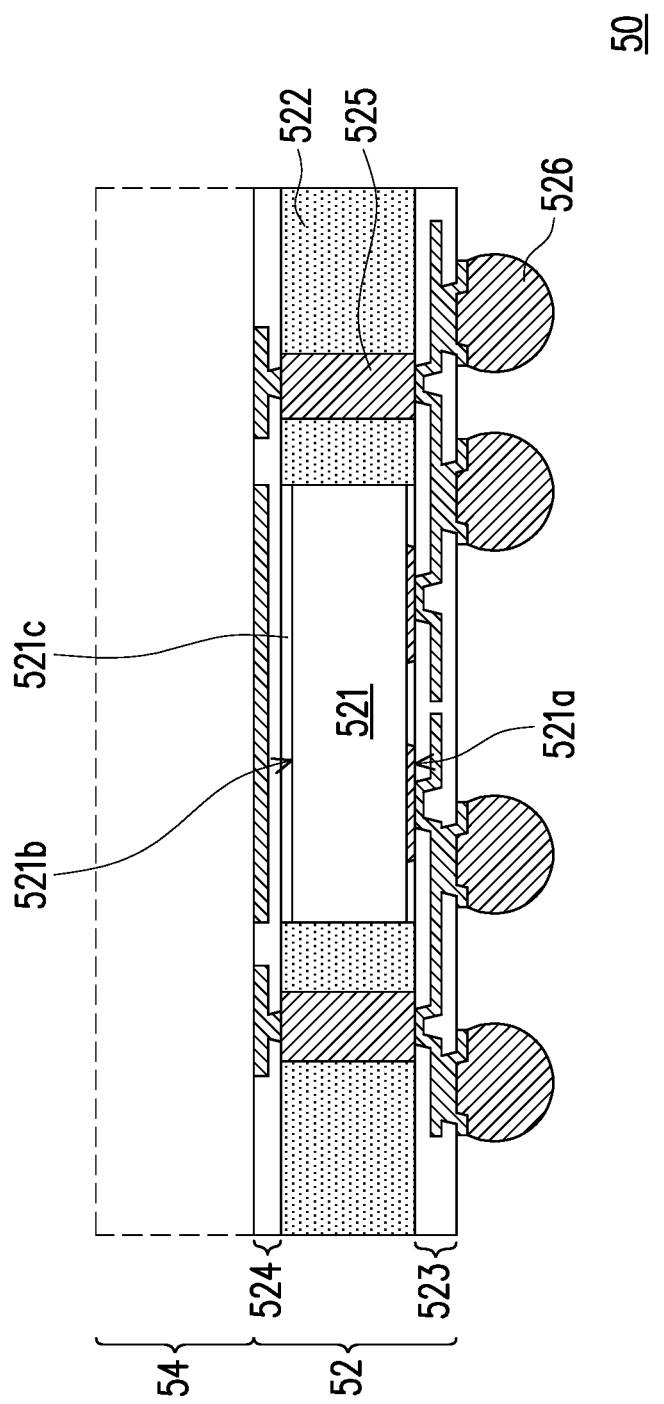
FIG. 9 illustrates a schematic cross-sectional view of a semiconductor package, in accordance with some embodiments.

FIG. 9 illustrates a schematic cross-sectional view of a semiconductor package, in accordance with some embodiments. Referring to FIG. 9, a semiconductor package 50 includes a first package component 52. For example, the first package component 52 includes a semiconductor die 521, an insulating encapsulation 521 laterally covering the semiconductor die 521, a front-side redistribution layer (RDL) 523 disposed over an active side 521a of the semiconductor die 521, a backside RDL 524 disposed over a rear side 521b of the semiconductor die 521, and through insulating vias (TIVs) 525 penetrating through the insulating encapsulation 521 to be electrically coupled to the front-side RDL 523 and the backside RDL 524. The backside RDL 524 may be attached to the rear side 521b of the semiconductor die 521 through a die attach film 521c. In some embodiments, the first package component 52 further includes conductive terminals 525 disposed on the front-side RDL 523, where the semiconductor die 521 is electrically coupled to the conductive terminals 525 through the front-side RDL 523 and the conductive terminals 525 may be further connected to external devices (e.g., printed circuit board (PCB), a printed wiring board, an interposer, a package substrate, and/or other carrier that is capable of carrying integrated circuits).

The integrated circuit die 521 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. The semiconductor device (e.g., 10 described in FIG. 1, 20 described in FIG. 5, or 30 described in FIG. 7) is the semiconductor die 521 or may be a part of the semiconductor die 521. Although the first package component 52 is illustrated as an Integrated-Fan-Out (InFO) package, the first package component 52 may be or may include a Chip-On-Wafer-On-Substrate (CoWoS) package, a Chip-On-Wafer (CoW) package, or the like, in accordance with other embodiments.

In some embodiments, the semiconductor package 50 includes a second package component 54 disposed on and electrically coupled to the first package component 52. For example, the second package component 54 is electrically coupled to the semiconductor die 521 at least through the backside RDL 524. The second package component 54 may be or may include a memory package, an antenna package, or the like. In some embodiments where the second package component 54 is an antenna package, the transmission line structure 1051 and the shielding structure (e.g., 1052, 2052U, 2052L, and/or 3052U) are disposed within the second package component 54, and the control second transistor 1022 may be formed within the second package component 54 or may be disposed within the semiconductor die 521 of the first package component 52. It should be noted that the configuration of the semiconductor package 50 is merely an example, the semiconductor package 50 may include more (or fewer) elements depending on the product requirements, and the orientation of the semiconductor die 521 may be flipped upside-down so that the active side 521a faces the second package component 54. Alternatively, the second package component 54 may be omitted.

Other packaging techniques may be used to form the semiconductor package 50, which are not limited in the disclosure. The semiconductor package 50 may be part of an electronic system for such as computers (e.g., high-performance computer), computational devices used in conjunction with an artificial intelligence system, wireless communication devices, computer-related peripherals, entertainment devices, etc. It should be noted that other electronic applications are also possible.

According to some embodiments, a device includes a transmission line structure including a signal line, a shielding structure conductive strips spaced apart from one and another and having lengthwise directions substantially perpendicular to a lengthwise direction of the signal line, a first transistor electrically coupled to the transmission line structure, and a second transistor a transistor electrically coupled to at least one of the conductive strips to control the at least one of the conductive strips to be electrically coupled to ground or electrically floating.

According to some alternative embodiments, a device includes a semiconductor substrate, an interconnect structure disposed over the semiconductor substrate, and a transmission line structure and a shielding structure that are embedded in the interconnect structure. The transmission line structure includes a signal line oriented substantially along a first direction, and the shielding structure includes conductive strips substantially parallel to each other and oriented substantially along a second direction transverse to the first direction. The conductive strips are switchable to be electrically coupled to ground or electrically floating.

According to some alternative embodiments, a method includes at least the following steps. Forming a semiconductor device includes forming transistors on a semiconductor substrate; forming a transmission line structure and a shielding structure in a dielectric layer over the semiconductor substrate, and forming metallization patterns in the dielectric layer to form an interconnect structure over the semiconductor substrate. The transmission line structure comprises a signal line, the shielding structure comprises conductive strips having lengthwise directions substantially perpendicular to a lengthwise direction of the signal line, and at least one of the conductive strips is electrically coupled to one of the transistors. After forming the semiconductor device, the one of the transistors is controlled to be turned on so that the at least one of the conductive strips is electrically coupled to ground based on a given operating frequency, where the at least one of the conductive strips is electrically floating as the one of the transistors is turned off.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device, comprising:
   a transmission line structure comprising a signal line;
   a shielding structure comprising:
      conductive strips spaced apart from one and another and having lengthwise directions substantially perpendicular to a lengthwise direction of the signal line;
   a first transistor electrically coupled to the transmission line structure; and a second transistor electrically coupled to at least one of the conductive strips to control the at least one of the conductive strips to be electrically coupled to ground or electrically floating.

2. The device of claim 1, wherein the at least one of the conductive strips is electrically coupled to ground as the second transistor is turned on, and the at least one of the conductive strips is electrically floating as the second transistor is turned off.

3. The device of claim 1, further comprising:
a semiconductor substrate on which the first and second transistors are disposed;
an interconnect structure overlying the semiconductor substrate and comprising a dielectric layer, wherein the transmission line structure and the shielding structure are embedded in the dielectric layer.

4. The device of claim 3, wherein the shielding structure is interposed between the transmission line structure and the semiconductor substrate and the conductive strips at least partially overlap the signal line.

5. The device of claim 1, wherein the at least one of the conductive strips electrically coupled to ground is interposed between closest two of the conductive strips which are electrically floating.

6. The device of claim 1, wherein the transmission line structure further comprises ground lines disposed at two opposing sides of the signal line and oriented substantially parallel to the signal line.

7. The device of claim 1, wherein the shielding structure comprises:
an upper portion disposed above the transmission line structure; and
a lower portion disposed below the transmission line structure, wherein the conductive strips of the upper portion are substantially aligned with the conductive strips of the lower portion in a thickness direction of the shielding structure.

8. The device of claim 1, wherein the shielding structure comprises:
an upper portion disposed above the transmission line structure; and
a lower portion disposed below the transmission line structure, wherein the conductive strips of the upper portion are laterally offset from the conductive strips of the lower portion in a thickness direction of the shielding structure.

9. The device of claim 1, wherein the shielding structure comprises:
an upper portion disposed above the transmission line structure; and
a lower portion disposed below the transmission line structure and interconnected to the upper portion.

10. The device of claim 1, further comprising:
an integrated fan-out package; and
an antenna package disposed on and coupled to the integrated fan-out package, wherein the transmission line structure and the shielding structure are disposed within the antenna package.

11. A device, comprising:
a semiconductor substrate;
an interconnect structure disposed over the semiconductor substrate;
a transmission line structure embedded in the interconnect structure and comprising:
a signal line oriented substantially along a first direction; and
a shielding structure embedded in the interconnect structure and comprising:
conductive strips substantially parallel to each other and oriented substantially along a second direction transverse to the first direction, the conductive strips being switchable to be electrically coupled to ground or electrically floating.

12. The device of claim 11, further comprising:
transistors disposed on the semiconductor substrate and below the interconnect structure, at least one of the transistors being electrically coupled to the conductive strips to control the conductive strips to be electrically coupled to ground or electrically floating.

13. The device of claim 11, wherein the conductive strips of the shielding structure are spaced apart from one and another through a dielectric layer of the interconnect structure.

14. The device of claim 11, wherein the shielding structure comprises:
an upper portion disposed above the transmission line structure; and
a lower portion disposed below the transmission line structure, wherein orthogonal projection areas of the conductive strips of the upper portion and the lower portion are at least partially overlapped with an orthogonal projection area of the signal line.

15. The device of claim 14, wherein the orthogonal projection areas of the conductive strips of the upper portion are laterally offset from that of the conductive strips of the lower portion.

16. The device of claim 14, wherein the orthogonal projection areas of the conductive strips of the upper portion are fully overlapped with that of the conductive strips of the lower portion.

17. The device of claim 14, wherein the number of the conductive strips of the upper portion is different from that of the conductive strips of the lower portion.

18. A method, comprising:
forming a semiconductor device comprising:
forming transistors on a semiconductor substrate;
forming a transmission line structure and a shielding structure in a dielectric layer over the semiconductor substrate, wherein the transmission line structure comprises a signal line, the shielding structure comprises conductive strips having lengthwise directions substantially perpendicular to a lengthwise direction of the signal line, and at least one of the conductive strips is electrically coupled to one of the transistors; and
forming metallization patterns in the dielectric layer to form an interconnect structure over the semiconductor substrate;
after forming the semiconductor device, controlling the one of the transistors to be turned on so that the at least one of the conductive strips is electrically coupled to ground based on a given operating frequency, wherein the at least one of the conductive strips is electrically floating as the one of the transistors is turned off.

19. The method of claim 18, wherein:
forming the shielding structure before forming the transmission line structure so that the transmission line structure is stacked over the shielding structure.

20. The method of claim 18, wherein:
forming a lower portion of the shielding structure before forming the transmission line structure, and
forming an upper portion of the shielding structure after forming the transmission line structure so that the transmission line structure is vertically interposed between the lower portion and the upper portion.

* * * * *